(12) United States Patent
Lee et al.

(10) Patent No.: US 7,232,728 B1
(45) Date of Patent: Jun. 19, 2007

(54) HIGH QUALITY OXIDE ON AN EPITAXIAL LAYER

(75) Inventors: Ruojia R. Lee, Boise, ID (US);
Randhir P. S. Thakur, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/593,949

(22) Filed: Jan. 30, 1996

(51) Int. Cl.
*H01L 21/336* (2006.01)

(52) U.S. Cl. ............... 438/300; 438/442; 438/770

(58) Field of Classification Search ........ 438/770, 438/300, 442
See application file for complete search history.

(56) References Cited

U.S. PATENT DOCUMENTS

| | | | |
|---|---|---|---|
| 3,571,918 A * | 3/1971 | Haberecht | 29/577 |
| 4,390,586 A * | 6/1983 | Lemelson | 428/209 |
| 4,764,248 A * | 8/1988 | Bhattacherjee et al. | 438/439 |
| 4,929,570 A * | 5/1990 | Howell | 437/89 |
| 4,966,861 A * | 10/1990 | Mieno et al. | 437/99 |
| 5,156,987 A | 10/1992 | Sandhu et al. | 437/40 |
| 5,242,666 A * | 9/1993 | Aoki | 422/245 |
| 5,266,510 A | 11/1993 | Lee | 437/44 |
| 5,294,571 A * | 3/1994 | Fujishiro et al. | 437/239 |
| 5,336,922 A | 8/1994 | Sakamoto | 257/534 |
| 5,360,751 A | 11/1994 | Lee | 437/35 |
| 5,360,769 A | 11/1994 | Thakur et al. | 437/239 |
| 5,362,981 A * | 11/1994 | Sato et al. | 257/371 |
| 5,376,593 A | 12/1994 | Sandhu et al. | 437/242 |
| 5,382,533 A | 1/1995 | Ahmad et al. | 437/24 |

(Continued)

FOREIGN PATENT DOCUMENTS

EP 0289246 11/1988

(Continued)

OTHER PUBLICATIONS

Wolf, Stanley, *Silicon Processing for the VLSI ERA*, vol. 1, (1986) pp. 140-141, 155-156, 1986.*

(Continued)

*Primary Examiner*—Thanh Nguyen
(74) *Attorney, Agent, or Firm*—Schwegman, Lundberg, Woessner & Kluth, P.A.

(57) ABSTRACT

This invention improves the quality of gate oxide dielectric layers using a two-pronged approach, thus permitting the use of much thinner silicon dioxide gate dielectric layers required for lower-voltage, ultra-dense integrated circuits. In order to eliminate defects caused by imperfections in bulk silicon, an in-situ grown epitaxial layer is formed on active areas following a strip of the pad oxide layer used beneath the silicon nitride islands used for masking during the field oxidation process. By growing an epitaxial silicon layer prior to gate dielectric layer formation, defects in the bulk silicon substrate are covered over and, hence, isolated from the oxide growth step. In order to maintain the integrity of the selective epitaxial growth step, the wafers are maintained in a controlled, oxygen-free environment until the epitaxial growth step is accomplished. In order to eliminate defects caused by a native oxide layer, the wafers are maintained in a controlled, oxygen-free environment until being subjected to elevated temperature in a controlled, oxidizing environment. In one embodiment, the oxidizing environment comprises diatomic oxygen, while in another embodiment, the oxidizing environment comprises diatomic oxygen and ozone.

24 Claims, 3 Drawing Sheets

U.S. PATENT DOCUMENTS

| | | | |
|---|---|---|---|
| 5,409,858 A | 4/1995 | Thakur et al. | 437/173 |
| 5,411,912 A | 5/1995 | Sakamoto | 437/60 |
| 5,444,279 A | 8/1995 | Lee | 257/316 |
| 5,445,999 A | 8/1995 | Thakur et al. | 437/242 |
| 5,589,410 A * | 12/1996 | Sato et al. | 437/40 |
| 5,637,518 A * | 6/1997 | Prall et al. | 438/301 |
| 6,174,366 B1 * | 1/2001 | Ihantola | 117/84 |

FOREIGN PATENT DOCUMENTS

| | | |
|---|---|---|
| EP | 0530046 | 3/1993 |
| EP | 0681315 | 11/1995 |
| JP | 63-125508 * | 11/1989 |
| JP | 01293665 | 11/1989 |
| JP | 4-162628 | 6/1992 |
| JP | 04326576 | 11/1992 |
| JP | 7-176742 * | 7/1995 |
| JP | 07176742 | 7/1995 |

OTHER PUBLICATIONS

Bergendahl, A. et al., "Cluster Processing for 16-Mb production", *Proceedings of the SPIE—The international Society for Optical Engineering* (1980) vol. 1188, p. 86-95.*

Hu, E.L., "High Technology Manufacturing: Critical Issues for the Future", Emerging Technologies for In Situ Processing, p. 45-54, 1988.*

Translation of JP 1-293665 (Aoki).*

Translation of JP 7-176742 (Toizumi).*

Ghandi, VLSI Fabrication Principles, 2nd ed., John Wiley & Sons: New York, 1994, pp. 452, 456.*

Nakanishi, T., et al., "Improvement in MOS Reliability by Oxidation in Ozone", *Symposium on VLSI Technology, IEEE Digest of Technical Papers*, Honolulu, Jun. 7-9, 1994, pp. 45-46.

Ohguro, T., et al., "Tenth Micron P-MOSFET's with Ultra-Thin Epitaxial Channel Layer Grown by Ultra-High-Vacuum CVD", *Proceedings: International Electron Devices Meeting, IEEE*, Washington, Dec. 5-8, 1993, pp. 433-436.

* cited by examiner

HIGH QUALITY OXIDE ON AN EPITAXIAL LAYER

FIELD OF THE INVENTION

This invention relates to integrated circuit manufacture and, more particularly, to the formation of ultra-thin high quality gate oxides that are useable in flash and dynamic random access memories.

BACKGROUND OF THE INVENTION

The thermal oxidation of silicon in a dry, oxygen ambient is a vital element in the manufacture of integrated circuits. Thermal oxides are used routinely as gate dielectric layers for field-effect transistors. As device dimensions are scaled down to increase circuit density, increasingly lower voltages are necessary to prevent channel punch-through and reduce the parasitic transistor effect between adjacent devices. With lower voltages, thinner gate dielectric layers are required. For example, the current of 4-megabit dynamic random access memories (DRAMs) typically uses gate oxide layers having a thickness within a range of 200 to 250 Å for both memory array and peripheral transistors. For 16-megabit DRAMs, this figure is expected to fall to 150 to 200 Å; for 64-megabit and 256-megabit DRAMs, the thickness is expected to fall still further. For electrically-programmable memories such as electrically-erasable programmable read-only memories (EEPROMs) and flash memories, even thinner gate oxide layers are required to facilitate Fowler-Nordheim tunneling (universally used as the erase mechanism and often as the write mechanism). For the current generation of 4-megabit flash memories, 110 Å-thick gate oxide layers are the norm. For future generations of more dense flash memories, gate oxide layers are expected to drop to the 80 to 90 Å range.

As gate oxide layers become thinner, it becomes increasingly important that such layers be defect free in order to eliminate leakage. Defects in the gate oxide layer have several sources. One major source of defects is the imperfections in the single-crystal bulk silicon from which starting wafers are manufactured. Such imperfections in the 10 single-crystal silicon lattice generally result from impurities, which may include metal atoms. Thermal growth of an oxide layer on top of bulk silicon will result in "pin holes" in the dielectric at the defect sites. Another major source of defects is the low quality of the native silicon dioxide which forms at room temperature on exposure to the atmosphere. Prior processes for forming a gate dielectric layer typically begin with a cleaning step which normally consists of a short-time dip in a hydrofluoric acid bath. Following the cleaning step, the wafers are generally exposed to the atmosphere, at which time a 3 to 7 Å-thick layer of native oxide forms on the surface of exposed bare silicon. The defects in native silicon dioxide are the result of the low temperature of formation (which results in oxides of uneven stoichiometry) and the uncontrolled content of the atmosphere (which results in trace amounts of compounds other than silicon dioxide).

U.S. Pat. No. 4,656,054 to Inoue describes a method of manufacturing a semiconductor device involving a capacitor, the primary object being to improve the method of mass-manufacturing chips containing a larger-capacitance capacitor. It does teach selectively growing a silicon layer on the substrate surface by an epitaxial growth method and then forming a gate oxide film by thermal oxidation. However, the objective of Inoue is to create a capacitor, the capacitance being controlled by the pattern and depth of etching into the insulation layer. Inoue's focus is on the ability to repeatably produce the same pattern of depressions and does not include any mention of a controlled manufacturing environment or an attempt to maximize the quality of the gate oxide layer. Inoue teaches improving capacitor performance and Inoue does not consider the quality of the substrate surface prior to the epitaxial growth step.

U.S. Pat. No. 5,013,681 to Godbey teaches removal of silicon oxide present on the active area after the wafer is placed in the growth chamber.

U.S. Pat. No. 4,870,245 to Price teaches an apparatus for plasma enhanced thermal treating of silicon-bearing materials. Price does not described increasing the effectiveness of fabrication steps through plasma enhancement.

U.S. Pat. No. 5,304,221 to Atherton teaches a process for modelling and controlling production integrated processing equipment (PIPE), although in the Background of the Invention section it makes passing reference to PIPEs being able to minimize human involvement and operate in a controlled environment, although "controlled environment" is not defined in Atherton.

What is lacking in the art is an improved method of forming silicon dioxide for use as gate dielectric layers which are less prone to leakage than those which are conventionally grown.

SUMMARY OF THE INVENTION

The present invention improves the quality of gate oxide dielectric layers by using a two-pronged approach. In order to eliminate defects caused by imperfections in the bulk silicon, an in-situ grown epitaxial layer is formed on active areas following a strip of the pad oxide layer used beneath the silicon nitride pattern used for masking during the field oxidation process. By growing an epitaxial silicon layer prior to gate dielectric layer formation, defects in the bulk silicon substrate are covered over and, hence, isolated from the oxide growth step. In order to maintain the integrity of the selective epitaxial growth step, the wafers are maintained in a controlled, oxygen-free environment until the epitaxial growth step is accomplished. In order to eliminate defects caused by a native oxide layer, the wafers are maintained in a controlled, oxygen-free environment until being subjected to elevated temperature in a controlled, oxidizing environment. In one embodiment, the oxidizing environment comprises diatomic oxygen, while in another embodiment, the oxidizing environment comprises diatomic oxygen and ozone.

PREFERRED EMBODIMENT OF THE INVENTION

Figure 1:
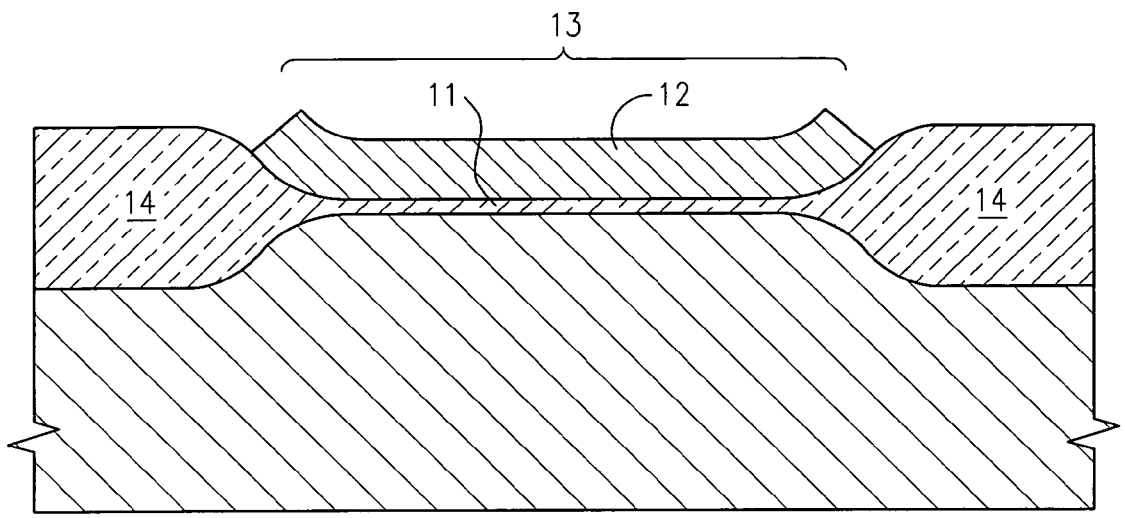
FIG. 1 is a cross-sectional view of a portion of an in-process semiconductor wafer immediately following field oxidation.

The method for forming a high quality gate oxide layer on a bulk silicon active area will be explained in the context of a conventional integrated circuit process flow. Referring now to FIG. 1, a semiconductor wafer has been subjected to a conventional field oxidation process known as LOCOS. The process involved forming a pad oxide layer 11 on top of the entire wafer, depositing an oxygen-impermeable silicon nitride layer on top of the pad oxide layer, patterning and etching the silicon nitride layer to form silicon nitride islands 12 which masked the active areas 13, and subjecting the wafer to an oxidation step which has formed field oxide regions 14.

Figure 2:
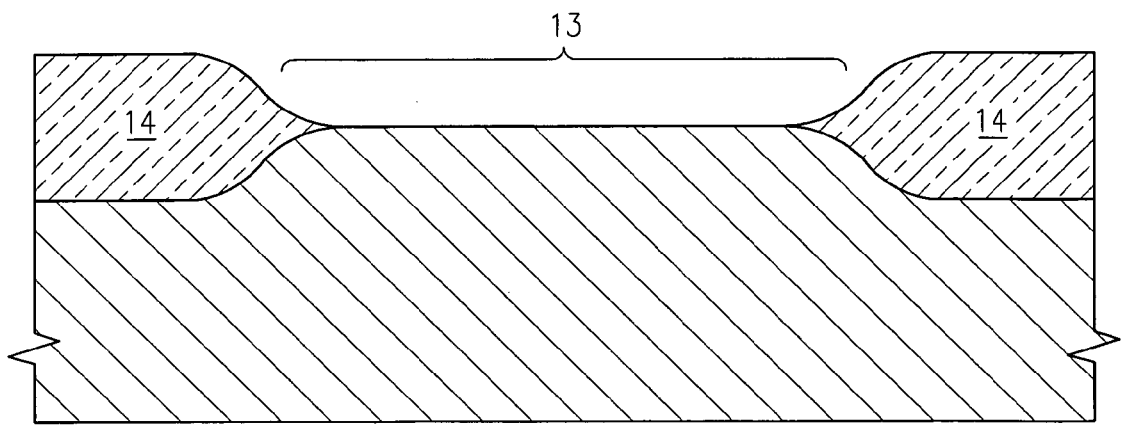
FIG. 2 is a cross-sectional view of the portion of an in-process semiconductor wafer depicted in FIG. 1 following removal of the silicon nitride masking layer and the pad oxide layer.

Referring now to FIG. 2, the silicon nitride islands 12 have been stripped, following which the pad oxide layer 11 that was beneath the islands is stripped in an oxygen-free environment to prevent a native oxide layer from forming on the exposed substrate once the pad oxide layer 11 is stripped.

Figure 3:
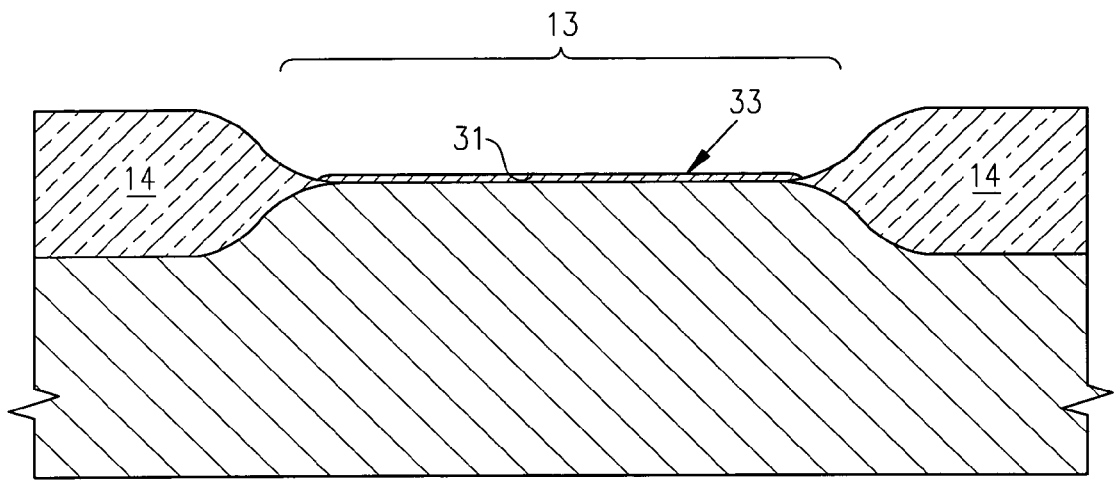
FIG. 3 is a cross-sectional view of the portion of an in-process semiconductor wafer depicted in FIG. 2 following selective epitaxial growth of a silicon layer on top of the active areas.

Referring now to FIG. 3, with the in-process wafer of FIG. 2 still being maintained in an oxygen-free environment, an epitaxial silicon layer 31 is selectively grown on top of the active areas 13. With selective epitaxial growth, no silicon is deposited on the field oxide regions 14. At an atomic level during the epitaxial growth step, silicon atoms possessing high surface mobility are deposited on the bare single-crystal silicon substrate in the active areas. The atoms migrate to sites on the single crystal substrate where nucleation is favored, thus forming a virtually defect-free layer of epitaxial silicon on top of the silicon substrate in the active areas 13.

Figure 4:
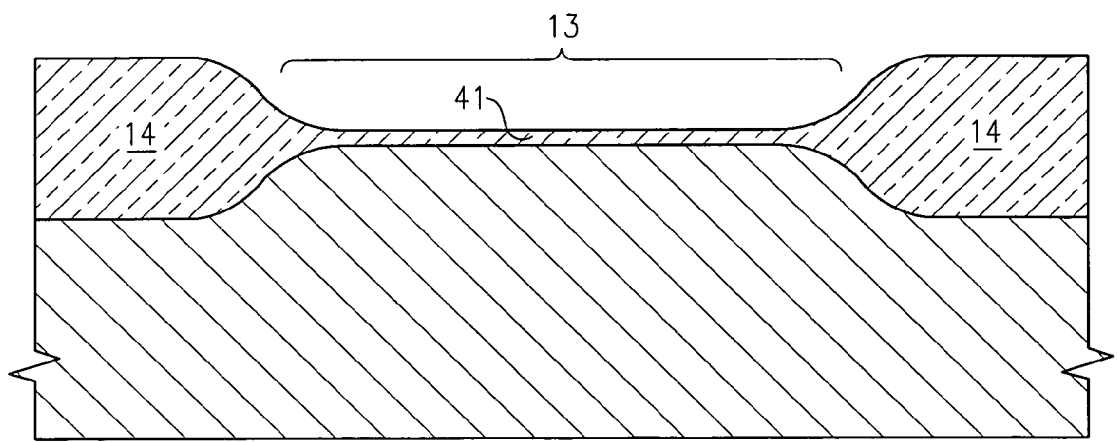
FIG. 4 is a cross-sectional view of the portion of an in-process semiconductor wafer depicted in FIG. 3 following a thermal oxidation step.
Figure 5:
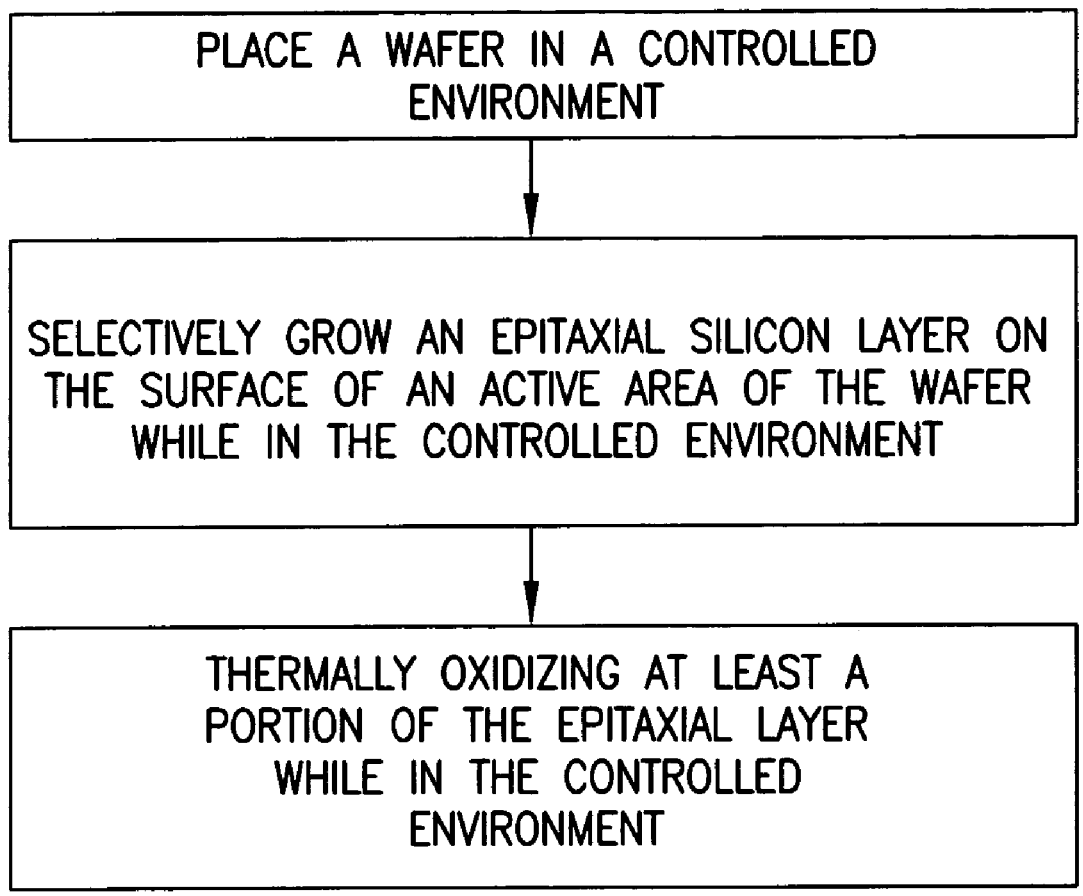
FIG. 5 is a flowchart showing a method for forming an oxide layer on a bulk silicon active area of a silicon wafer according to an embodiment of the invention.

Referring now to FIG. 4, the in-process wafer is subjected to a thermal oxidation step, which oxidizes an upper portion 33 of the epitaxial layer 31 (FIG. 3) to form a gate oxide layer 41. The oxidation step is allowed to proceed until the appropriate thickness of gate oxide is achieved. it is essential that between the epitaxial growth step depicted in FIG. 3 and the oxidation step depicted in FIG. 4, the wafer be protected from the atmosphere to prevent the formation of a native oxide layer on the active areas. Thus, the wafer must either be maintained in an inert atmosphere or in a vacuum chamber in which the partial pressure of oxygen is very nearly zero. Processing of the wafer following the formation of the high-quality gate oxide layer 41 may be entirely conventional, with a polysilicon layer or a layer of other material suitable for gate electrodes being deposited on top of the gate oxide layer 41. The polysilicon layer is doped, then patterned and etched to form gate electrodes.

Through the process of the present invention, the quality of gate oxide dielectric layers is thus improved by using the two-pronged approach described above. In order to eliminate defects caused by imperfections in the bulk silicon, an in-situ grown epitaxial layer is formed on active areas following a strip of the pad oxide layer used beneath the silicon nitride pattern used for masking during the field oxidation process. By growing an epitaxial silicon layer prior to gate dielectric layer formation, defects in the bulk silicon substrate are covered over and, hence, isolated from the oxide growth step.

In order to maintain the integrity of the selective epitaxial growth step, the wafers are maintained in a controlled, oxygen-free environment until the epitaxial growth step is accomplished. In the alternative, the controlled environment is a low-pressure, virtually oxygen-free environment. In order to eliminate defects caused by a native oxide layer, the wafers are maintained in a controlled, oxygen-free environment until being subjected to elevated temperature in a controlled, oxidizing environment. In one embodiment, the oxidizing environment comprises diatomic oxygen, while in another embodiment, the oxidizing environment comprises diatomic oxygen and ozone.

Although only a single embodiment of the invention has been disclosed herein, it will be obvious to those having ordinary skill in the art of integrated circuit manufacture that certain changes and modifications may be made thereto without departing from the scope and the spirit of the invention as hereinafter claimed.

We claim:

1. A method for forming an oxide layer on a silicon wafer, the method comprising:
    forming a pad oxide layer on the silicon wafer;
    forming a nitride island on the pad oxide layer to mask an active area of the silicon wafer;
    forming field oxide regions in non-active areas;
    stripping the nitride island;
    stripping the pad oxide layer in an oxygen-free environment, wherein the pad oxide layer being stripped in the oxygen-free environment is the pad oxide layer formed beneath the nitride island before the nitride island was stripped;
    maintaining the wafer in a controlled environment;
    exposing the active area while the controlled environment is in a first state, wherein the first state comprises an environmental state selected from the group consisting of the oxygen-free environment and a low-pressure, virtually oxygen-free environment, wherein the controlled environment is maintained continuously between stripping the pad oxide layer and exposing the active area;
    selectively growing an epitaxial silicon layer only on the surface of the active area while depositing substantially no silicon on the field oxide regions, and while the controlled environment is in the first state so as to cover defects in the silicon wafer present in the active area;
    thermally oxidizing at least a portion of the epitaxial silicon layer while the controlled environment is in a second state, thereby forming a non-sacrificial oxide layer, wherein the second state is an oxidizing environment; and
    maintaining the controlled environment in the first state continuously between selectively growing the epitaxial silicon layer and forming the non-sacrificial oxide layer.

2. The method of claim 1, further comprising preventing a formation of a native oxide layer on the surface of the active area prior to selectively growing the epitaxial silicon layer.

3. The method of claim 1, wherein the oxidizing environment comprises oxygen in a form selected from the group consisting of diatomic oxygen, and ozone and diatomic oxygen.

4. A method for forming an oxide layer on a silicon wafer, the method comprising:
    forming a pad oxide layer on the silicon wafer;
    forming a nitride island on the pad oxide layer to mask an active area of the silicon wafer;

forming field oxide regions in non-active areas;

stripping the nitride island;

stripping the pad oxide layer in an oxygen-free environment, wherein the pad oxide layer being stripped in the oxygen-free environment is the pad oxide layer formed beneath the nitride island before the nitride island was stripped;

maintaining the wafer in a controlled environment;

exposing the active area while the controlled environment is in a first state, wherein the first state is the oxygen-free environment, wherein the controlled environment is maintained continuously between stripping the pad oxide layer and exposing the active area;

selectively growing an epitaxial silicon layer only on the surface of the active area while depositing substantially no silicon on the field oxide regions and while the controlled environment is in the first state so as to cover defects in the silicon wafer present in the active area;

thermally oxidizing at least a portion of the epitaxial silicon layer while the controlled environment is in a second state, thereby forming a non-sacrificial oxide layer, wherein the second state is an oxidizing environment; and maintaining the controlled environment in the first state continuously between selectively growing the epitaxial silicon layer and forming the non-sacrificial oxide layer.

5. The method of claim 4, further comprising preventing a formation of a native oxide layer on the surface of the active area prior to selectively growing the epitaxial silicon layer.

6. The method of claim 4, wherein the oxidizing environment comprises oxygen in a form selected from the group consisting of diatomic oxygen, and ozone and diatomic oxygen.

7. A method for forming an oxide layer on a silicon wafer, the method comprising:

forming a pad oxide layer on the silicon wafer;

forming a nitride island on the pad oxide layer to mask an active area of the silicon wafer;

forming field oxide regions in non-active areas;

stripping the nitride island;

stripping the pad oxide layer in an oxygen-free environment, wherein the pad oxide layer being stripped in the oxygen-free environment is the pad oxide layer formed beneath the nitride island before the nitride island was stripped;

maintaining the wafer in a controlled environment;

exposing the active area while the controlled environment is in a first state, wherein the first state is the oxygen-free environment, wherein the controlled environment is maintained continuously between stripping the pad oxide layer and exposing the active area;

selectively growing an epitaxial silicon layer only on the surface of the active area while depositing substantially no silicon on the field oxide regions and while the controlled environment is in the first state so as to cover defects in the silicon wafer present in the active area;

thermally oxidizing at least a portion of the epitaxial silicon layer while the controlled environment is in a second state, thereby forming a non-sacrificial oxide layer only over the epitaxial silicon layer portion;

maintaining the controlled environment in the first state continuously between selectively growing the epitaxial silicon layer and forming the non-sacrificial oxide layer; and preventing the formation of a native oxide layer on the surface of the active area prior to selectively growing an epitaxial silicon layer.

8. A method for forming an oxide layer on a silicon wafer, the method comprising:

forming a pad oxide layer on the silicon wafer;

forming a nitride island on the pad oxide layer to mask an active area of the silicon wafer;

forming field oxide regions in non-active areas;

stripping the nitride island;

stripping the pad oxide layer in an oxygen-free environment, wherein the pad oxide layer being stripped in the oxygen-free environment is the pad oxide layer formed beneath the nitride island before the nitride island was stripped;

maintaining the wafer in a controlled environment;

exposing the active area while the controlled environment is in a first state, wherein the first state is the oxygen-free environment, wherein the controlled environment is maintained continuously between stripping the pad oxide layer and exposing the active area;

selectively growing an epitaxial silicon layer only on the surface of the active area while depositing substantially no silicon on the field oxide regions and while the controlled environment is in the first state so as to cover defects in the silicon wafer present in the active area;

thermally oxidizing at least a portion of the epitaxial silicon layer while the controlled environment is in a second state only over the epitaxial silicon layer portion, thereby forming a non-sacrificial oxide layer, wherein the second state is an oxidizing environment comprising diatomic oxygen; and maintaining the controlled environment in the first state continuously between selectively growing the epitaxial silicon layer and forming the non-sacrificial oxide layer.

9. A method for forming an oxide layer on a silicon wafer, the method comprising:

forming a pad oxide layer on the silicon wafer;

forming a nitride island on the pad oxide layer to mask an active area of the silicon wafer;

forming field oxide regions in non-active areas;

stripping the nitride island;

stripping the pad oxide layer in an oxygen-free environment, wherein the pad oxide layer being stripped in the oxygen-free environment is the pad oxide layer formed beneath the nitride island before the nitride island was stripped;

maintaining the wafer in a controlled environment;

exposing the active area while the controlled environment is in a first state, wherein the first state is the oxygen-free environment, wherein the controlled environment is maintained continuously between stripping the pad oxide layer and exposing the active area;

selectively growing an epitaxial silicon layer only on the surface of the active area while depositing substantially no silicon on the field oxide regions and while the controlled environment is in the first state so as to cover defects in the silicon wafer present in the active area;

thermally oxidizing at least a portion of the epitaxial silicon layer while the controlled environment is in a second state only over the epitaxial silicon layer portion, thereby forming a non-sacrificial oxide layer, wherein the second state is an oxidizing environment comprising ozone and diatomic oxygen; and maintaining the controlled environment in the first state continuously between selectively growing the epitaxial silicon layer and forming the non-sacrificial oxide layer.

10. A method for forming an oxide layer on a silicon wafer, the method comprising:
forming a pad oxide layer on the silicon wafer;
forming a nitride island on the pad oxide layer to mask an active area of the silicon wafer;
forming field oxide regions in non-active areas;
stripping the nitride island;
stripping the pad oxide layer in an oxygen-free environment, wherein the pad oxide layer being stripped in the oxygen-free environment is the pad oxide layer formed beneath the nitride island before the nitride island was stripped;
maintaining the wafer in a controlled environment;
exposing the active area while the controlled environment is in a first state, wherein the first state is a low-pressure, virtually oxygen-free environment, wherein the controlled environment is maintained continuously between stripping the pad oxide layer and exposing the active area;
selectively growing an epitaxial silicon layer only on the surface of the active area while depositing substantially no silicon on the field oxide regions and while the controlled environment is in the first state so as to cover defects in the silicon wafer present in the active area;
thermally oxidizing at least a portion of the epitaxial silicon layer while the controlled environment is in a second state only over the epitaxial silicon layer portion, thereby forming a non-sacrificial oxide layer, wherein the second state is an oxidizing environment; and
maintaining the controlled environment in the first state continuously between selectively growing the epitaxial silicon layer and forming the non-sacrificial oxide layer.

11. The method of claim 10, further comprising preventing a formation of a native oxide layer on the surface of the active area prior to selectively growing the epitaxial silicon layer.

12. The method of claim 10, wherein the oxidizing environment comprises oxygen in a form selected from the group consisting of diatomic oxygen, and ozone and diatomic oxygen.

13. A method for forming an oxide layer on a silicon wafer, the method comprising:
forming a pad oxide layer on the silicon wafer;
forming a nitride island on the pad oxide layer to mask an active area of the silicon wafer;
forming field oxide regions in non-active areas;
stripping the nitride island;
stripping the pad oxide layer in an oxygen-free environment, wherein the pad oxide layer being stripped in the oxygen-free environment is the pad oxide layer formed beneath the nitride island before the nitride island was stripped;
maintaining the wafer in a controlled environment;
exposing the active area while the controlled environment is in a first state, wherein the first state is a low-pressure, virtually oxygen-free environment, wherein the controlled environment is maintained continuously between stripping the pad oxide layer and exposing the active area;
selectively growing an epitaxial silicon layer only on the surface of the active area while depositing substantially no silicon on the field oxide regions and while the controlled environment is in the first state;
thermally oxidizing at least a portion of the epitaxial silicon layer while the controlled environment is in a second state, thereby forming a non-sacrificial oxide layer, wherein the second state is an oxidizing environment comprising oxygen in a form selected from the group consisting of diatomic oxygen, and ozone and diatomic oxygen;
maintaining the controlled environment in the first state continuously between selectively growing the epitaxial silicon layer and forming the non-sacrificial oxide layer; and
preventing the formation of a native oxide layer on the surface of the active area prior to selectively growing an epitaxial silicon layer.

14. A method for forming an oxide layer on a silicon wafer, the method comprising:
forming a pad oxide layer on the silicon wafer;
forming a nitride island on the pad oxide layer to mask an active area of the silicon wafer;
forming field oxide regions in non-active areas;
stripping the nitride island;
stripping the pad oxide layer in an oxygen-free environment, wherein the pad oxide layer being stripped in the oxygen-free environment is the pad oxide layer formed beneath the nitride island before the nitride island was stripped;
maintaining the wafer in a controlled environment;
exposing the active area while the controlled environment is in a first state, wherein the first state is a low-pressure, virtually oxygen-free environment, wherein the controlled environment is maintained continuously between stripping the pad oxide layer and exposing the active area;
selectively growing an epitaxial silicon layer only on the surface of the active area while depositing substantially no silicon on the field oxide regions and while the controlled environment is in the first state so as to cover defects in the silicon wafer present in the active area;
thermally oxidizing at least a portion of the epitaxial silicon layer while the controlled environment is in a second state only over the epitaxial silicon layer portion, thereby forming a non-sacrificial oxide layer, wherein the second state is an oxidizing environment comprising diatomic oxygen; and
maintaining the controlled environment in the first state continuously between selectively growing the epitaxial silicon layer and forming the non-sacrificial oxide layer.

15. A method for forming an oxide layer on a silicon wafer, the method comprising:
forming a pad oxide layer on the silicon wafer;
forming a nitride island on the pad oxide layer to mask an active area of the silicon wafer;
forming field oxide regions in non-active areas;
stripping the nitride island;
stripping the pad oxide layer in an oxygen-free environment, wherein the pad oxide layer being stripped in the oxygen-free environment is the pad oxide layer formed beneath the nitride island before the nitride island was stripped;
maintaining the wafer in a controlled environment;
exposing the active area while the controlled environment is in a first state, wherein the first state is a low-pressure, virtually oxygen-free environment, wherein the controlled environment is maintained continuously between stripping the pad oxide layer and exposing the active area;

selectively growing an epitaxial silicon layer only on the surface of the active area while depositing substantially no silicon on the field oxide regions and while the controlled environment is in the first state so as to cover defects in the silicon wafer present in the active area;

thermally oxidizing at least a portion of the epitaxial silicon layer while the controlled environment is in a second state only over the epitaxial silicon layer portion, thereby forming a non-sacrificial oxide layer, wherein the second state is an oxidizing environment comprising ozone and diatomic oxygen; and maintaining the controlled environment in the first state continuously between selectively growing the epitaxial silicon layer and forming the non-sacrificial oxide layer.

16. A method for forming an oxide layer on a silicon wafer, the method comprising:

forming a pad oxide layer on the silicon wafer;

forming a nitride island on the pad oxide layer to mask an active area of the silicon wafer;

forming field oxide regions in non-active areas;

stripping the nitride island;

stripping the pad oxide layer in an oxygen-free environment, wherein the pad oxide layer being stripped in the oxygen-free environment is the pad oxide layer formed beneath the nitride island before the nitride island was stripped;

maintaining the wafer in a controlled environment;

exposing the active area while the controlled environment is in a first state, wherein the first state comprises an environmental state selected from the group consisting of the oxygen-free environment and a low-pressure, virtually oxygen-free environment, wherein the controlled environment is maintained continuously between stripping the pad oxide layer and exposing the active area;

selectively growing an epitaxial silicon layer only on the surface of the active area while depositing substantially no silicon on the field oxide regions and while the controlled environment is in the first state as to cover defects in the silicon wafer present in the active area;

thermally oxidizing a portion of the epitaxial silicon layer while the controlled environment is in a second state, thereby forming a non-sacrificial oxide atop the epitaxial silicon layer, wherein the second state is an oxidizing environment; and maintaining the controlled environment in the first state continuously between selectively growing the epitaxial silicon layer and forming the non-sacrificial oxide layer.

17. The method of claim 16, further comprising preventing a formation of a native oxide layer on the surface of the active area prior to selectively growing the epitaxial silicon layer.

18. The method of claim 16, wherein the oxidizing environment comprises oxygen in a form selected from the group consisting of diatomic oxygen, and ozone and diatomic oxygen.

19. A method for forming an oxide layer on a silicon wafer, the method comprising:

forming a pad oxide layer on the silicon wafer;

forming a nitride island on the pad oxide layer to mask an active area of the silicon wafer;

forming field oxide regions in non-active areas;

stripping the nitride island;

stripping the pad oxide layer in an oxygen-free environment, wherein the pad oxide layer being stripped in the oxygen-free environment is the pad oxide layer formed beneath the nitride island before the nitride island was stripped;

maintaining the wafer in a controlled environment;

exposing the active area while the controlled environment is in a first state, wherein the first state is the oxygen-free environment, wherein the controlled environment is maintained continuously between stripping the pad oxide layer and exposing the active area;

selectively growing an epitaxial silicon layer only on the surface of the active area while depositing substantially no silicon on the field oxide regions and while the controlled environment is in the first state so as to cover defects in the silicon wafer present in the active area;

thermally oxidizing a portion of the epitaxial silicon layer while the controlled environment is in a second state, thereby forming a non-sacrificial oxide layer atop the epitaxial silicon layer, wherein the second state is an oxidizing environment; and maintaining the controlled environment in the first state continuously between selectively growing the epitaxial silicon layer and forming the non-sacrificial oxide layer from a portion of the epitaxial silicon layer.

20. The method of claim 19, further comprising preventing a formation of a native oxide layer on the surface of the active area prior to selectively growing the epitaxial silicon layer.

21. The method of claim 19, wherein the oxidizing environment comprises oxygen in a form selected from the group consisting of diatomic oxygen, and ozone and diatomic oxygen.

22. A method for forming an oxide layer on a silicon wafer, the method comprising:

forming a pad oxide layer on the silicon wafer;

forming a nitride island on the pad oxide layer to mask an active area of the silicon wafer;

forming field oxide regions in non-active areas;

stripping the nitride island;

stripping the pad oxide layer in an oxygen-free environment, wherein the pad oxide layer being stripped in the oxygen-free environment is the pad oxide layer formed beneath the nitride island before the nitride island was stripped;

maintaining the wafer in a controlled environment;

exposing the active area while the controlled environment is in a first state, wherein the first state is the oxygen-free environment, wherein the controlled environment is maintained continuously between stripping the pad oxide layer and exposing the active area;

selectively growing an epitaxial silicon layer only on the surface of the active area while depositing substantially no silicon on the field oxide regions and while the controlled environment is in the first state so as to cover defects in the silicon wafer present in the active area;

thermally oxidizing an upper portion of the epitaxial silicon layer while the controlled environment is in a second state, thereby forming a non-sacrificial oxide layer only over the epitaxial silicon layer portion, wherein the second state is an oxidizing environment comprising oxygen in a form selected from the group consisting of diatomic oxygen, and ozone and diatomic oxygen;

maintaining the controlled environment in the first state continuously between selectively growing the epitaxial silicon layer and forming the non-sacrificial oxide layer; and preventing the formation of a native oxide layer on the surface of the active area prior to selectively growing an epitaxial silicon layer.

23. A method for forming an oxide layer on a silicon wafer, the method comprising:

forming a pad oxide layer on the silicon wafer;

forming a nitride island on the pad oxide layer to mask an active area of the silicon wafer;

forming field oxide regions in non-active areas;

stripping the nitride island;

stripping the pad oxide layer in an oxygen-free environment, wherein the pad oxide layer being stripped in the oxygen-free environment is the pad oxide layer formed beneath the nitride island before the nitride island was stripped;

maintaining the wafer in a controlled environment;

exposing the active area while the controlled environment is in a first state, wherein the first state is a low-pressure, virtually oxygen-free environment, wherein the controlled environment is maintained continuously between stripping the pad oxide layer and exposing the active area;

selectively growing an epitaxial silicon layer only on the surface of the active area while depositing substantially no silicon on the field oxide regions and while the controlled environment is in the first state;

thermally oxidizing an upper portion of the epitaxial silicon layer while the controlled environment is in a second state, thereby forming a non-sacrificial oxide layer, wherein the second state is an oxidizing environment comprising oxygen in a form selected from the group consisting of diatomic oxygen, and ozone and diatomic oxygen;

maintaining the controlled environment in the first state continuously between selectively growing the epitaxial silicon layer and forming the non-sacrificial oxide layer; and preventing the formation of a native oxide layer on the surface of the active area prior to selectively growing an epitaxial silicon layer.

24. A method for forming an oxide layer on a silicon wafer, the method comprising:

forming a pad oxide layer on the silicon wafer;

forming a nitride island on the pad oxide layer to mask an active area of the silicon wafer;

forming field oxide regions in non-active areas;

stripping the nitride island;

stripping the pad oxide layer in an oxygen-free environment, wherein the pad oxide layer being stripped in the oxygen-free environment is the pad oxide layer formed beneath the nitride island before the nitride island was stripped;

maintaining the wafer in a controlled environment;

exposing the active area while the controlled environment is in a first state, wherein the first state is a low-pressure, virtually oxygen-free environment, wherein the controlled environment is maintained continuously between stripping the pad oxide layer and exposing the active area;

selectively growing an epitaxial silicon layer only on the surface of the active area while depositing substantially no silicon on the field oxide regions and while the controlled environment is in the first state so as to cover defects in the silicon wafer present in the active area;

thermally oxidizing a portion of the epitaxial silicon layer while the controlled environment is in a second state only over the epitaxial silicon layer portion, thereby forming a non-sacrificial oxide layer, wherein the second state is an oxidizing environment comprising diatomic oxygen; and maintaining the controlled environment in the first state continuously between selectively growing the epitaxial silicon layer and forming the non-sacrificial oxide layer.

* * * * *